United States Patent
Wang et al.

(10) Patent No.: US 6,590,282 B1
(45) Date of Patent: Jul. 8, 2003

(54) STACKED SEMICONDUCTOR PACKAGE FORMED ON A SUBSTRATE AND METHOD FOR FABRICATION

(75) Inventors: Hsing-Seng Wang, Hsinchu (TW); Rong-Shen Lee, Hsin-chu (TW); Chia-Chung Wang, Bade (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/038,232

(22) Filed: Apr. 12, 2002

(51) Int. Cl.$^7$ ................................................. H01L 23/02
(52) U.S. Cl. ........................ 257/686; 257/685; 257/777
(58) Field of Search ................................ 257/686, 685, 257/777, 783, 503

(56) References Cited

U.S. PATENT DOCUMENTS

| | | | |
|---|---|---|---|
| 5,907,903 A | * | 6/1999 | Ameen et al. ................ 29/830 |
| 6,215,182 B1 | * | 4/2001 | Ozawa et al. ............... 357/723 |
| 6,501,165 B1 | * | 12/2002 | Farnworth et al. .......... 257/686 |
| 6,509,639 B1 | * | 1/2003 | Lin ............................. 257/686 |
| 2002/0135057 A1 | * | 9/2002 | Kurita ......................... 257/685 |

FOREIGN PATENT DOCUMENTS

| | | | | |
|---|---|---|---|---|
| JP | 58-92230 | * | 6/1983 | ................ 257/686 |
| JP | 59-127856 | * | 7/1984 | ................ 257/686 |

* cited by examiner

Primary Examiner—Jasmine J B Clark
(74) Attorney, Agent, or Firm—Tung & Associates

(57) ABSTRACT

A stacked semiconductor package formed on a substrate arranged in a serpentine configuration and a method for such fabrication are disclosed. The package is formed by at least one substrate section formed on the substrate bonded to at least one IC die by a flip-chip bonding method. The substrate is then folded onto itself such that the backside of a first IC die is adhesively bonded to the backside of a second IC die. A heat sink may optionally be utilized in-between the IC dies during the adhesive bonding process to further enhance thermal dissipation. The substrate section may be bonded to a printed circuit board by a plurality of solder balls formed on an active surface of the substrate section. The present invention can be bonded to a printed circuit board either in a horizontal position or in a vertical position for saving more real-estate on the board.

11 Claims, 3 Drawing Sheets

STACKED SEMICONDUCTOR PACKAGE FORMED ON A SUBSTRATE AND METHOD FOR FABRICATION

FIELD OF THE INVENTION

The present invention generally relates to a high density stacked semiconductor package and a method for fabrication and more particularly, relates to a high density stacked semiconductor package that is formed on a substrate and arranged in a serpentine configuration and a method for such fabrication.

BACKGROUND OF THE INVENTION

Stacked semiconductor packages have been used in recent years for achieving high density packaging on limited circuit board real-estate. A conventional stacked semiconductor package is formed by stacking semiconductor dies in an up-and-down configuration and then connecting the lead frames, or lead fingers from each die, together for electrical communication with an outside circuit. In the lead frame-type stacked semiconductor packages, the total thickness of the package achieved cannot be efficiently reduced in order to reduce the real-estate required for mounting a package. Furthermore, the dies that are packaged together are in electrical communication such that there is little flexibility in the application of the stacked packages. There has been little technology developed for forming stacked semiconductor packages for IC chips.

It is therefore an object of the present invention to provide a stacked semiconductor package that is formed of flip-chip bonded elements that does not have the drawbacks or shortcomings of the conventional stacked semiconductor packages.

It is another object of the present invention to provide a stacked semiconductor package that can be formed by flip-chip bonded elements each consisting of an IC die and an electronic substrate.

It is a further object of the present invention to provide a stacked semiconductor package that is formed on a substrate wherein the substrate can be folded onto itself.

It is another further object of the present invention to provide a stacked semiconductor package that is formed on a substrate and arranged in a serpentine configuration.

It is still another object of the present invention to provide a stacked semiconductor package that is formed on a substrate of polyimide.

It is yet another object of the present invention to provide a stacked semiconductor package that is formed on a substrate wherein IC dies are first flip-chip bonded to substrates and are then bonded to each other in a back-to-back relationship.

It is still another further object of the present invention to provide a method for forming a stacked semiconductor package on a substrate in a serpentine configuration.

SUMMARY OF THE INVENTION

In accordance with the present invention, a stacked semiconductor package formed on a substrate and arranged in a serpentine configuration and a method for fabricating such package are disclosed.

In a preferred embodiment, a stacked semiconductor package formed on a substrate arranged in a serpentine configuration is provided which includes a first substrate section that is formed on a first section of the substrate which has an insulating layer bonded to and a first plurality of I/O pads formed on a bottom surface, a first plurality of solder balls formed on the first plurality of I/O pads, a second plurality of I/O pads formed on a top surface through the first section of the substrate, a second plurality of solder bumps formed on the second plurality of I/O pads, and a third plurality of metal wiring formed in the insulating layer providing electrical communicating between the first plurality of I/O pads and the second plurality of I/O pads; a first IC die that has a fourth plurality of solder bumps formed in an active surface for bonding to the second plurality of solder bumps formed in the first substrate section; a second substrate section formed on a second section of the substrate that has an insulating layer bonded to and a first plurality of I/O pads formed on a top surface, a second plurality of I/O pads formed on a bottom surface through the second section of the substrate, a second plurality of solder bumps formed on the second plurality of I/O pads, and a third plurality of metal wiring formed in the insulating layer providing electrical communication between the first and the second plurality of I/O pads; a second IC die that has a fourth plurality of solder bumps formed in an active surface for bonding to the second plurality of solder bumps formed in the second substrate section; and a first U-shaped section of the substrate integrally connecting the first and the second section of the substrate such that an inactive surface of the first IC die is adhesively bonded to an inactive surface of the second IC die in a back-to-back relationship forming the stacked semiconductor package.

The stacked semiconductor package may further include a third substrate section having a structure substantially similar to the first substrate section; a third IC die that has a structure substantially similar to the first IC die; a fourth substrate section that has a structure substantially similar to the second substrate section; a fourth IC die that has a structure substantially similar to the second IC die; a second U-shaped section of the substrate integrally connecting the second and the third section of the substrate such that the top surface of the second substrate section is bonded to the bottom surface of the third substrate section by an electrically insulating adhesive; and a third U-shaped section of the substrate integrally connecting the third and the fourth sections of the substrate such that an inactive surface of the third IC die is adhesively bonded to an inactive surface of the fourth IC die in a back-to-back relationship forming the stacked semiconductor package. The package may further include a printed circuit board bonded to the first plurality of solder balls, or a passivation layer on the top and the bottom surfaces of the first and the second substrate sections for insulating the first and the second plurality of I/O pads.

The stacked semiconductor package may further include a metal lead layer on the top surface of the first substrate section and the bottom surface of the second substrate section for providing electrical communication between the two substrate sections. The package may further include an underfill layer for filling a gap formed between the second plurality of solder bumps and the top surface of the first substrate section and the second plurality of solder bumps on the bottom surface of the second substrate section. The underfill layer may be formed of an elastomeric material, while the passivation layer may be a solder mask. The substrate may be formed of a polymeric material, while the metal lead layer may be formed of copper. The package may further include a heat sink adhesively bonded between the first IC die and the second IC die.

The present invention is further directed to a method for forming a stacked semiconductor package on a substrate in a serpentine configuration which can be carried out by the operating steps of first providing a substrate of continuous length; laminating a plurality of insulating substrates to a bottom surface of the substrate in a spaced-apart relationship; forming a first plurality of I/O pads on a bottom surface of each of the plurality of insulating substrates insulated from each other by a passivation layer; forming a first plurality of solder balls on the first plurality of I/O pads; forming a second plurality of I/O pads in the substrate on top of each plurality of insulating substrates, each of the second plurality of I/O pads in electrical communication with one of the first plurality of I/O pads by metal wiring provided in the insulating substrate; forming a second plurality of solder bumps on the second plurality of I/O pads; providing a first IC die that has a second plurality of solder bumps formed on an active surface; bonding the second plurality of solder bumps on the substrate to the second plurality of solder bumps on the first IC die by mounting the first IC die on top of the substrate in a face-down position; dispensing an adhesive on an upward-facing inactive surface of the first IC die; and folding the substrate such that the first IC die is bonded to a second IC die in a back-to-back relationship forming the stacked semiconductor package.

The method for forming a stacked semiconductor package may further include the steps of adhesively bonding a third IC die to a fourth IC die in a back-to-back relationship, and a second insulating substrate to a third insulating substrate in a back-to-back relationship. The method may further include the step of bonding the first plurality of solder balls to a plurality of conductive pads on a printed circuit board, or the step of forming the first and second plurality of I/O pads by a photolithographic method, or the step of forming the first and second plurality of I/O pads in a conductive metal selected from the group consisting of Al, Cu, Al alloys and Cu alloys. The method may further include the step of forming the first and second plurality of solder bumps by a method selected from the group consisting of electroplating, screen printing, stencil printing and electroless plating. The method may further include the step of bonding a heat sink between the first IC die and the second IC die. The method may further include the step of dispensing the adhesive in a thermally conductive adhesive that contains metal particles, or the step of dispensing an underfill material in a gap formed between the first and the second plurality of solder bumps.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
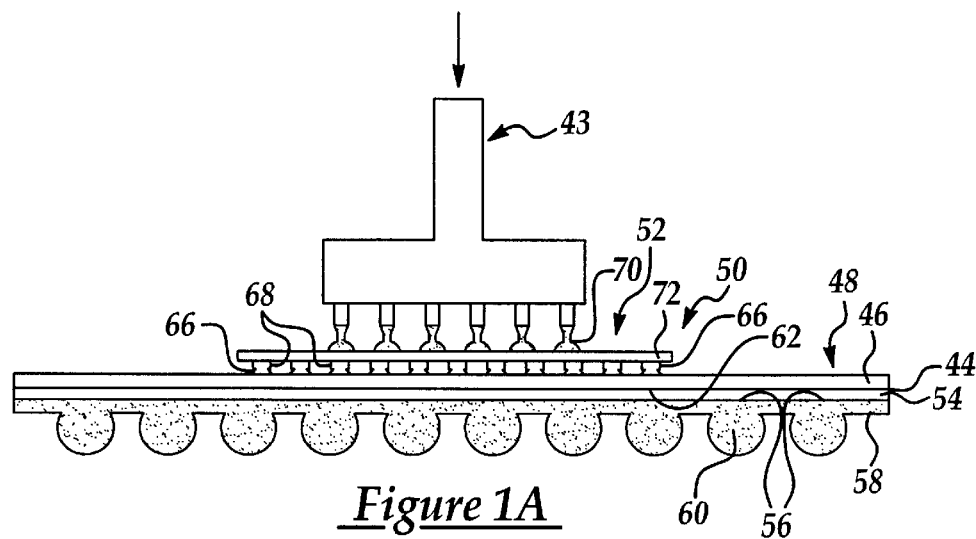
FIG. 1A is an enlarged, cross-sectional view of a present invention package element formed of a substrate section and an IC die wherein an adhesive is applied to the back of the IC die.

The present invention discloses a stacked semiconductor package that is formed on a substrate and arranged in a serpentine configuration and a method for fabricating such package.

The package is constructed by a first substrate section formed on a first section of a substrate that has an insulating layer bonded to and a first plurality of I/O pads formed on a bottom surface of the insulating layer, a first plurality of solder balls formed on the first plurality of I/O pads and a second plurality of I/O pads formed on a top surface through the first section of the substrate. The first substrate section further has a second plurality of solder bumps formed on the second plurality of I/O pads, and a third plurality of metal wiring formed in the insulating layer providing electrical communication between the first plurality of I/O pads and the second plurality of I/O pads. The package is further constructed by a first IC die that has a fourth plurality of solder bumps formed in an active surface for bonding to the second plurality of solder bumps formed in the first substrate section; and a second substrate section formed on a second section of the substrate that has an insulating layer bonded thereto and a first plurality of I/O pads formed on a top surface. The second substrate section is further provided with a second plurality of I/O pads formed on a bottom surface through the second section of the substrate, and a second plurality of solder bumps formed on the second plurality of I/O pads. A third plurality of metal wiring is further provided in the insulating layer for electrically connecting the first plurality of I/O pads to the second plurality of I/O pads. The package further includes a second IC die that has a fourth plurality of solder bumps formed in an active surface for bonding to the second plurality of solder bumps formed in the second substrate section; and a first U-shaped section of the substrate that integrally connects the first and the second section of the substrate such that an inactive surface of the first IC die is adhesively bonded to an inactive surface of the second IC die in a back-to-back relationship forming the stacked semiconductor package.

The invention further discloses a method for forming a stacked semiconductor package on a substrate in a serpentine configuration. The substrate may be a continuous length that has a plurality of insulating substrates bonded or laminated to a bottom surface in a spaced-apart relationship. A first plurality of I/O pads is then formed on the insulating substrate and insulated by a passivation layer, while a plurality of solder bumps is then deposited onto the first plurality of I/O pads. After an IC die with a plurality of solder bumps formed on an active surface is bonded to the substrate, a layer of adhesive is applied onto the inactive side, or the backside of the IC die. The procedure is repeated to form at least one other substrate section and by bonding at least one IC die to the substrate section in the continuous length of the substrate. The substrate is then folded onto itself by bonding the inactive sides of the IC dies together by the adhesive applied and optionally, by further bonding a backside of a substrate to a backside of another substrate section such that a serpentine-shaped stacked package can be formed.

By utilizing the present invention stacked semiconductor package, the thickness of the total package can be substantially kept at a minimum, i.e. in a super thin package. The IC dies may be electrically connected to each other for meeting a special requirement of electrical circuit layout and therefore, provides more flexibility in circuit design. Still further, a heat sink can be added in-between the IC dies, or in-between the substrate sections, to provide enhanced heat dissipation property to the package.

Referring now to FIG. 1A, wherein an enlarged, cross-sectional view of a single section of the present invention stacked semiconductor package is shown. The section 50 shown consists of an IC die 52 flip-chip bonded to a substrate 48. The substrate 48 is formed by a continuous length of a substrate 44 that has a metal lead layer 46 formed on top. As shown in FIG. 1A, the substrate 44 is then laminated to an insulating substrate layer 54 with a plurality of I/O pads 56 formed in a bottom surface insulated by a passivation layer 58 therein-between. On top of each of the plurality of I/O pads 56, is then planted a plurality of solder balls 60 by a technique such as pick-and-place. On the upper surface of the substrate section 48, is also formed a plurality of I/O pads 62 insulated by a passivation layer 64 in-between the I/O pads 62. On top of the plurality of I/O pads 62, is then formed a plurality of solder bumps 66 for use in the next step flip-chip bonding process. An IC die 52 with a plurality of solder bumps 68 formed in an active surface is then bonded to the plurality of solder bumps 66 on the substrate section 48 in a flip-chip bonding process.

In the final step of the process for forming the first package element 50, an adhesive material 70 is dispensed onto the back surface 72 of the IC die 52 through an adhesive dispensing head 43. The adhesive material 70 dispensed is preferably a thermoset-type of adhesive such as epoxy that contains metal particles for enhanced heat dissipation property.

Figure 1B:
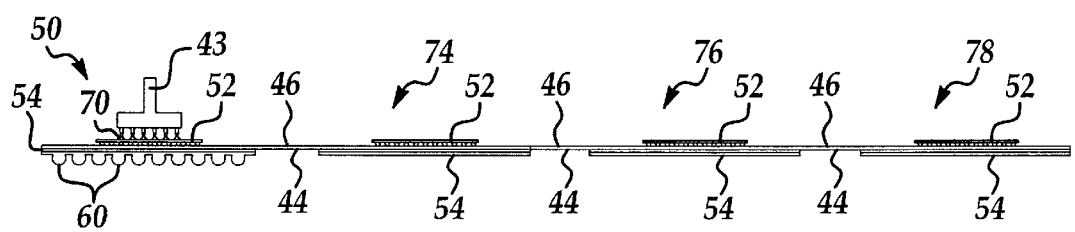
FIG. 1B is a cross-sectional view of a continuous length of the present invention substrate with a plurality of IC dies bonded thereto in a spaced-apart relationship.

A continuous length section of the substrate 44 is shown in FIG. 1B with a plurality of IC die 52 bonded thereon. It is seen that a second package element 74, a third package element 76 and a fourth package element 78 are sequentially formed on the continuous length of substrate 44 by techniques similar to that in forming the first package element 50. It should be noted that the metal lead layer 46 is also shown in FIG. 1B on top of the substrate 44. A suitable substrate 44 to be used in the present invention is one that is formed of a polymeric material. A suitable polymeric material is polyimide for its superior temperature and chemical resistance.

Figure 2A:
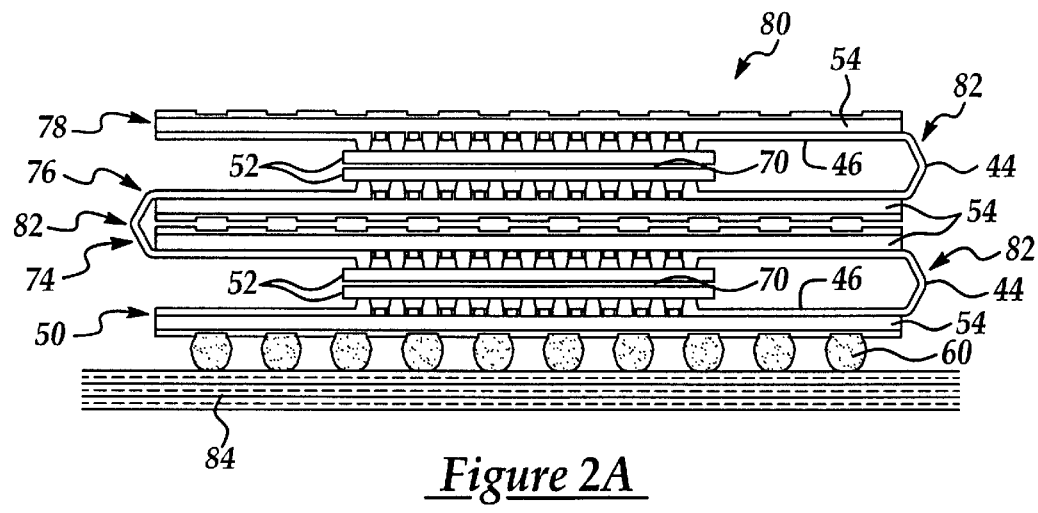
FIG. 2A is an enlarged, cross-sectional view of a preferred embodiment of the present invention stacked semiconductor package.

After the continuous length of the substrate 44 is fabricated with a plurality of IC dies 52 flip-chip bonded thereon, the present invention stacked semiconductor package 80 can be formed in a preferred embodiment shown in FIG. 2A. The stacked package 80 is formed by the first package element 50, the second package element 74, the third package element 76 and the fourth package element 78. Each of the package elements is formed by a substrate section 48 and an IC die 52, shown in FIGS. 1A and 1B. The package 80 is formed by folding the substrate 44 in U-shaped sections 82, as shown in FIG. 2A. It should be noted that the plurality of solder balls 60 on the first package element 50 is bonded to a printed circuit board (PCB) 84 through a plurality of conductive pads (not shown) on the surface of the PCB 84. The package 80 is formed by first folding the substrate 44 onto itself, and then bonding the IC dies 52 together in a back-to-back relationship by an adhesive 70 dispensed onto the IC chip 52 on its inactive surface 72. The metal lead layer 46 provides electrical communication between the IC dies 52 and can be arranged in any suitable configuration for a specific circuit.

Figure 2B:
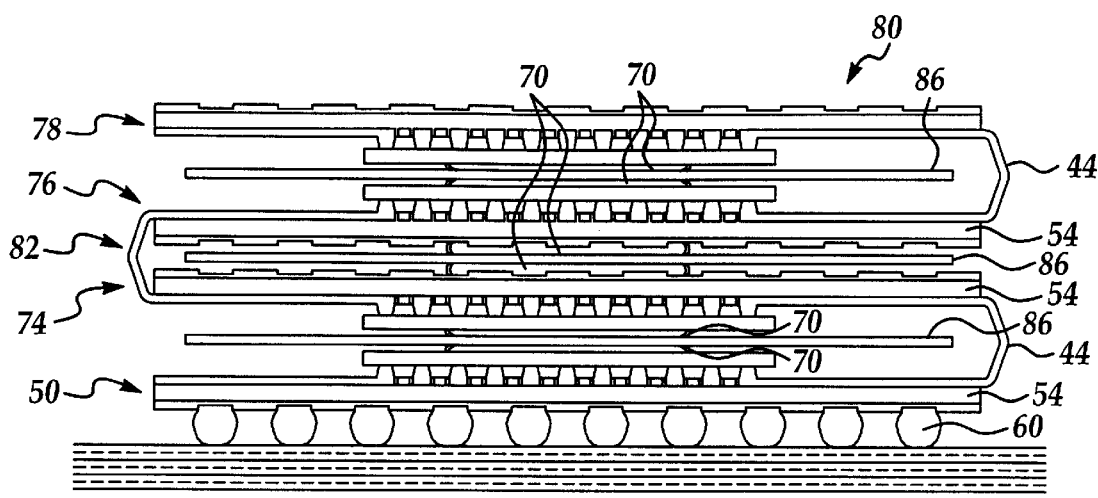
FIG. 2B is an enlarged, cross-sectional view of the preferred embodiment of the present invention stacked semiconductor package incorporating a plurality of heat sinks.

A stacked package 80 that further incorporates a plurality of heat sinks 86 bonded in-between the IC dies 52 and in-between the substrates 54 is shown in FIG. 2B. It is seen that in this configuration, the heat dissipation from the IC dies 52 can be significantly enhanced. The heat sinks 86 can be suitably provided in a thermally conductive material such as aluminum.

Figure 3A:
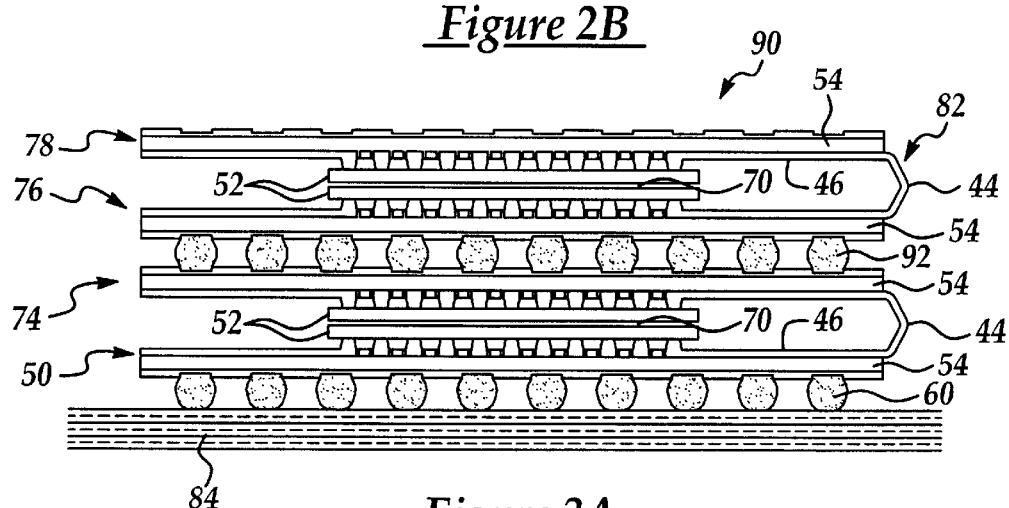
FIG. 3A is an enlarged, cross-sectional view of a first alternate embodiment of the present invention stacked semiconductor package.
Figure 3B:
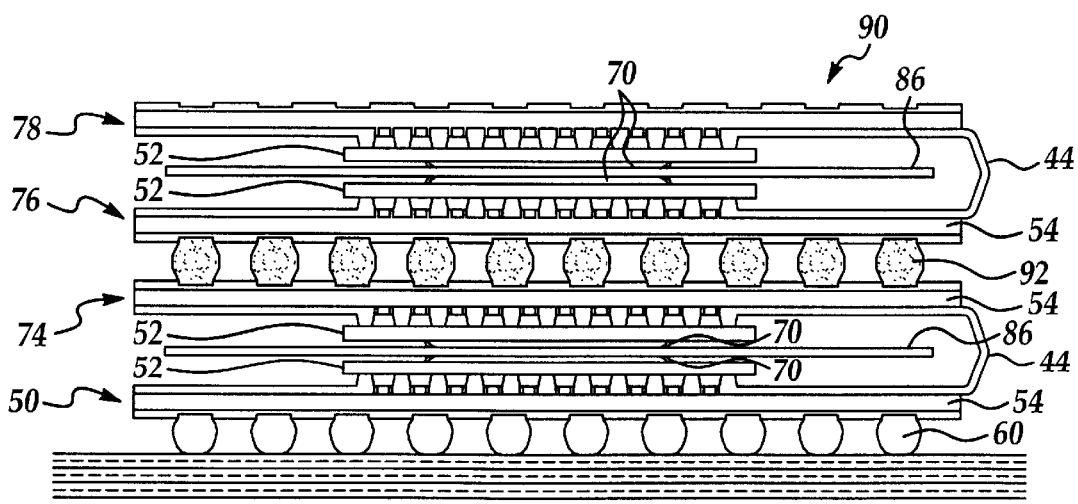
FIG. 3B is an enlarged, cross-sectional view of the first alternate embodiment of the present invention stacked semiconductor package incorporating a plurality of heat sinks.

A first alternate embodiment of the present invention stacked semiconductor package is shown in FIGS. 3A and 3B. The stacked package 90 is formed by four package elements 50,74,76 and 78 similar to that in the preferred embodiment, however, with the U-shaped substrate 82 removed in-between the package element 74 and the package element 76. The electrical communication between the IC dies 52 in the second package element 74 and the third package element 76 is established, instead of by the metal lead layer 46, by a plurality of solder balls 92. The first alternate embodiment package 90 is further shown in FIG. 3B with improved thermal dissipation by utilizing a plurality of heat sinks 86.

Figure 4A:
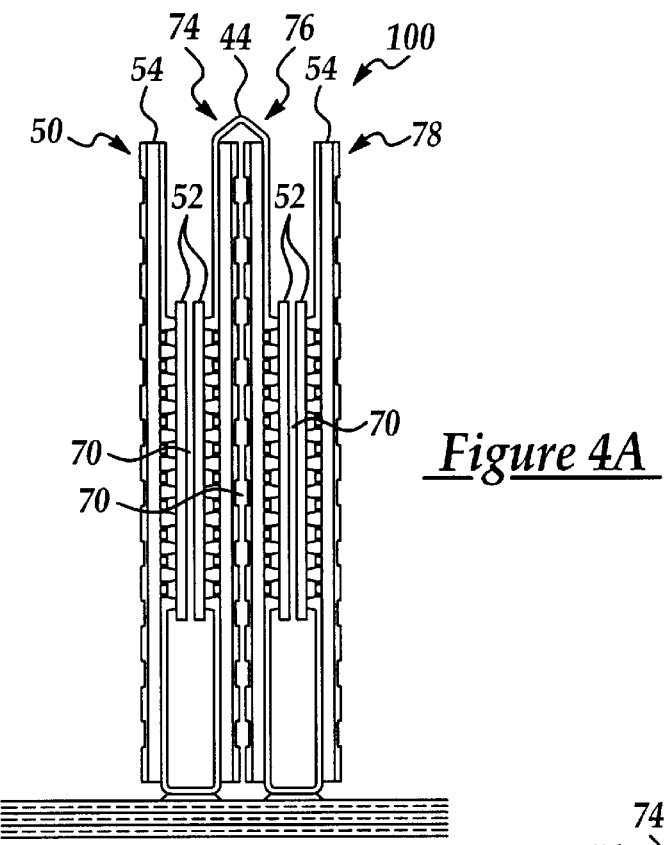
FIG. 4A is an enlarged, cross-sectional view of a second alternate embodiment of the present invention stacked semiconductor package mounted in a vertical position.
Figure 4B:
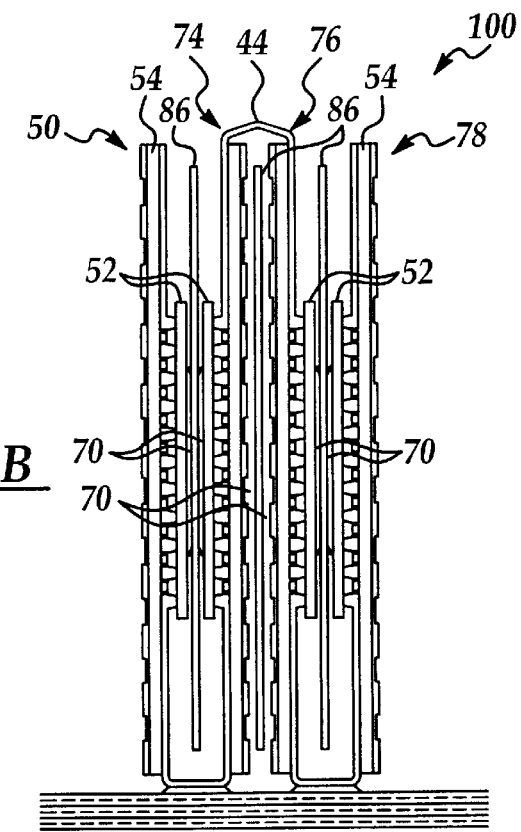
FIG. 4B is an enlarged, cross-sectional view of the second alternate embodiment of the present invention stacked semiconductor package incorporating a plurality of heat sinks.

A second alternate embodiment of the present invention stacked semiconductor package 100 is shown in FIGS. 4A and 4B. In this second alternate embodiment, which is substantially similar to the preferred embodiment, the package 100 can be mounted to a printed circuit board 84 in a vertical position. The mounting is achieved by a solder bump 94 while the package 100 is bonded to the printed circuit board 84 by an epoxy adhesive 70. The second alternate embodiment package 100 further provides the benefit that a smaller PCB real-estate is required for mounting the package to the PCB. The package 100 may further incorporate a plurality of heat sinks 86, as shown in FIG. 4B.

The present invention novel stacked semiconductor package formed on a substrate and arranged in a serpentine configuration and a method for such fabrication have therefore been amply described in the above description and in the appended drawings of FIGS. 1A–4B.

While the present invention has been described in an illustrative manner, it should be understood that the terminology used is intended to be in a nature of words of description rather than of limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows:

What is claimed is:

1. A stacked semiconductor package formed on a substrate arranged in a serpentine configuration comprising:
   a first substrate section formed on a first section of said substrate having an insulating layer bonded to and a first plurality of I/O pads formed on a bottom surface, a first plurality of solder balls formed on said first plurality of I/O pads, a second plurality of I/O pads formed on a top surface through said first section of the substrate, a second plurality of solder bumps formed on said second plurality of I/O pads, and a third plurality of metal wiring formed in said insulating layer providing electrical communication between said first plurality of I/O pads and said second plurality of I/O pads;

a first IC die having a fourth plurality of solder bumps formed in an active surface for bonding to said second plurality of solder bumps formed in said first substrate section;

a second substrate section formed on a second section of said substrate having an insulating layer bonded to and a first plurality of I/O pads formed on a top surface, a second plurality of I/O pads formed on a bottom surface through said second section of the substrate, a second plurality of solder bumps formed on said second plurality of I/O pads, and a third plurality of metal wiring formed in said insulating layer providing electrical communication between said first and said second plurality of I/O pads;

a second IC die having a fourth plurality of solder bumps formed in an active surface for bonding to said second plurality of solder bumps formed in said second substrate section; and a first U-shaped section of said substrate integrally connecting said first and said second section of the substrate such that an inactive surface of said first IC die is adhesively bonded to an inactive surface of said second IC die in a back-to-back relationship forming said stacked semiconductor package.

2. A stacked semiconductor package formed on a substrate arranged in a serpentine configuration according to claim 1 further comprising:

a third substrate section having a structure substantially similar to said first substrate section;

a third IC die having a structure substantially similar to said first IC die;

a fourth substrate section having a structure substantially similar to said second substrate section;

a fourth IC die having a structure substantially similar to said second IC die;

a second U-shaped section of said substrate integrally connecting said second and said third section of the substrate such that said top surface of said second substrate section is bonded to said bottom surface of said third substrate section by an electrically insulating adhesive; and a third U-shaped section of said substrate integrally connecting said third and said fourth section of the substrate such that an inactive surface of said third IC die is adhesively bonded to an inactive surface of said fourth IC die in a back-to-back relationship forming said stacked semiconductor package.

3. A stacked semiconductor package formed on a substrate arranged in a serpentine configuration according to claim 1 further comprising a printed circuit board bonded to said first plurality of solder balls.

4. A stacked semiconductor package formed on a substrate arranged in a serpentine configuration according to claim 1 further comprising a passivation layer on said top and said bottom surface of said first and said second substrate section for insulating said first and said second plurality of I/O pads.

5. A stacked semiconductor package formed on a substrate arranged in a serpentine configuration according to claim 1 further comprising a metal lead layer on said top surface of said first substrate section and said bottom surface of said second substrate section for providing electrical communication between said two substrate sections.

6. A stacked semiconductor package formed on a substrate arranged in a serpentine configuration according to claim 1 further comprising an underfill layer filling a gap formed between said second plurality of solder bumps on said top surface of the first substrate section and said second plurality of solder bumps on said bottom surface of the second substrate section.

7. A stacked semiconductor package formed on a substrate arranged in a serpentine configuration according to claim 6, wherein said underfill layer being formed of an elastomeric material.

8. A stacked semiconductor package formed on a substrate arranged in a serpentine configuration according to claim 4, wherein said passivation layer is a solder mask.

9. A stacked semiconductor package formed on a flexible substrate arranged in a serpentine configuration according to claim 1, wherein said substrate being formed of a polymeric material.

10. A stacked semiconductor package formed on a substrate arranged in a serpentine configuration according to claim 5, wherein said metal lead layer being formed of copper.

11. A stacked semiconductor package formed on a substrate arranged in a serpentine configuration according to claim 1 further comprising a heat sink adhesively bonded between said first IC die and said second IC die.

* * * * *